(12) United States Patent
Lee

(10) Patent No.: US 11,672,089 B2
(45) Date of Patent: Jun. 6, 2023

(54) SENSOR DETECTION OF MAGNETIC SUPPORT SYSTEM FOR ELECTRONIC DEVICES

(71) Applicant: Apple Inc., Cupertino, CA (US)

(72) Inventor: Simon S. Lee, San Jose, CA (US)

(73) Assignee: APPLE INC., Cupertino, CA (US)

(*) Notice: Subject to any disclaimer, the term of this patent is extended or adjusted under 35 U.S.C. 154(b) by 322 days.

(21) Appl. No.: 17/031,364

(22) Filed: Sep. 24, 2020

(65) Prior Publication Data
US 2022/0095466 A1  Mar. 24, 2022

(51) Int. Cl.
*H05K 5/02* (2006.01)
*G01D 5/14* (2006.01)

(52) U.S. Cl.
CPC .......... *H05K 5/0234* (2013.01); *G01D 5/145* (2013.01)

(58) Field of Classification Search
CPC .. F16M 11/041; H05K 5/0234; H05K 5/0017; F16B 1/00; F16B 2001/0035; G01D 5/145
See application file for complete search history.

(56) References Cited

U.S. PATENT DOCUMENTS

| | | | | |
|---|---|---|---|---|
| 8,553,408 B2* | 10/2013 | Supran | .................. | G06F 1/1632 361/679.02 |
| 8,897,033 B2* | 11/2014 | Slipy | .................. | H04M 1/0202 361/679.01 |

* cited by examiner

*Primary Examiner* — James Wu
(74) *Attorney, Agent, or Firm* — Dorsey & Whitney LLP

(57) ABSTRACT

Support systems for electronic devices such as display screens are described and have support connector portions configured to connect to support devices such as adjustable mount supports. The support devices have magnetic elements, and the display devices have magnetic sensors configured to detect the magnetic fields emitted from the support devices. A relationship between the magnetic fields detected and target magnetic field values is determined to provide an output signal or indicator of the propriety of the support device used or the propriety of its connection to the display device.

20 Claims, 9 Drawing Sheets

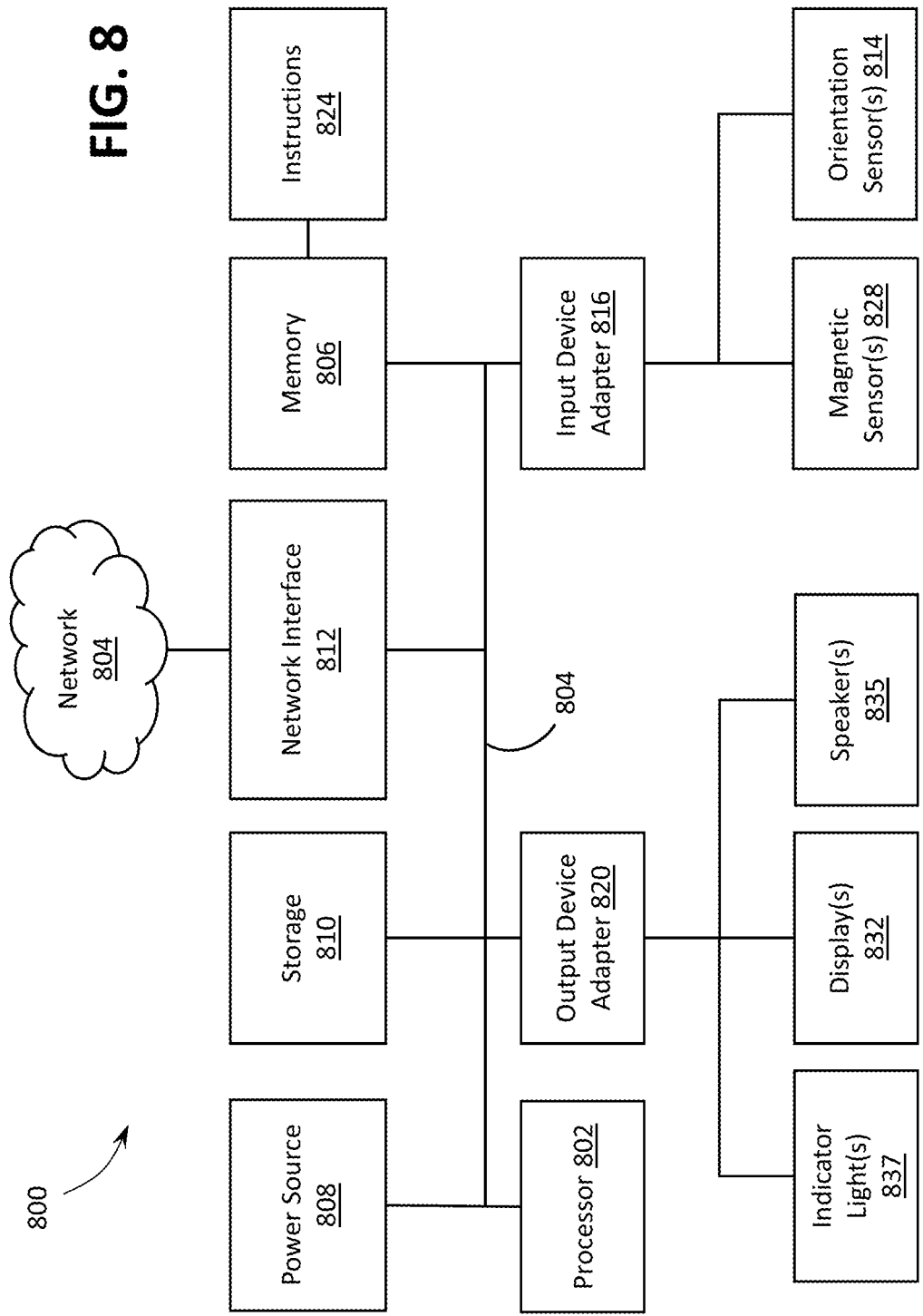

SENSOR DETECTION OF MAGNETIC SUPPORT SYSTEM FOR ELECTRONIC DEVICES

FIELD

The described embodiments relate generally to supports for electronic devices. More particularly, the present embodiments relate to a connector detection system for a computing device support.

BACKGROUND

Computer device designers often desire to control positioning of a computer monitor or similar display at whatever height and orientation best suited for the needs of the user. This enables the display to accommodate users and desktop surfaces of different heights, sizes, and postures. Users also generally prefer to adjust the positioning of the monitor with little expended effort.

While various existing display stands provide tilt, rotation, and vertical height adjustment of monitors, these features often come at the expense of being convenient and natural to use. For example, it can be difficult to mount the monitor to a stand, especially when the rear side of the monitor is not easily accessible or the monitor is to be mounted to the stand while the stand is in a standing position. These issues can make using a display stand difficult, awkward, and time consuming and impede the stand from having a high quality, satisfying user experience. There is therefore a constant need for improvements to stands and supports for electronic devices.

SUMMARY

Aspects of the present disclosure relate to a support system for an electronic device that can comprise a housing structure comprising a support connector portion configured to magnetically couple the housing structure to a support device, an electronic circuit, and a magnetic sensor in the housing structure and in electronic communication with the electronic circuit. The magnetic sensor can be configured to output a signal to the electronic circuit based on a magnetic field sensed from the support connector portion or from the support device.

In some embodiments, the housing structure is part of a display screen, the support connector portion comprises a recess configured to receive the support device, the magnetic sensor is positioned adjacent the recess, and the magnetic sensor is configured to detect a magnetic field emitted from the support device while the support device is received by the recess.

In some embodiments, the housing structure can be part of a display screen. The signal can be variable based on a magnitude of the magnetic field. The support connector portion can comprise a recess to receive the support device. The magnetic sensor can be positioned adjacent to the recess. The signal can be emitted when the magnetic sensor senses that the magnetic field is within a range of values through which output of the magnetic sensor is proportional to the magnetic field sensed. The range of values can comprise a lower boundary and an upper boundary, with the lower boundary being non-zero, and with output of the magnetic sensor at the upper boundary being proportional to the magnetic field sensed. In some configurations, the signal can indicate an orientation of the support connector portion relative to the support device.

Another aspect of the disclosure relates to a support system for an electronic device which includes a support mount having a magnetic structure, a display device housing having a magnetic sensor configured to sense a magnetic field emitted from the magnetic structure, with the display device housing being mountable to the support mount, and a computing device in electronic communication with the magnetic sensor. The computing device can be configured to detect an output signal by the magnetic sensor and output an indicator signal indicating whether the sensed magnetic field is within a range of values.

In some embodiments, the computing device is further configured to output a second indicator signal indicating that the sensed magnetic field is not within the range of values. Outputting the indicator signal can comprise displaying a graphic via a display device in the display device housing. The indicator signal can indicate an offset of the magnetic structure relative to the display device housing. The magnetic sensor can comprise Hall effect sensors, and the support mount can comprise permanent magnets. The Hall effect sensors can be arranged spaced around a perimeter or circumference of a portion of the display device housing, wherein the permanent magnets are spaced around a perimeter or circumference of a portion of the support mount, and wherein the Hall effect sensors are spaced between the permanent magnets around the perimeter or circumference of the portion of the display device housing.

Furthermore, another aspect of the disclosure relates to a computing device comprising an output device having a magnetic sensor, a processor in electronic communication with the magnetic sensor and configured to provide an output signal to the output device, a memory device in electronic communication with the processor and having electronic instructions stored therein. When the electronic instructions are executed by the processor, they can cause the processor to determine that the magnetic sensor senses a magnetic field, determine a vector quantity representing the magnetic field sensed by the magnetic sensor, determine a difference between the vector quantity and a target vector quantity, and output an alert via the output device if the difference exceeds a threshold.

The vector quantity and the target vector quantity can each be three-dimensional vectors. A stand for the output device can also be included, wherein the magnetic field can be emitted from a magnetic element on the stand. The alert can comprise an indicator of a direction to move the output device to attach the output device to a stand. The threshold can comprise a range of values that are all less than a maximum output of the magnetic sensor.

Yet another aspect of the disclosure relates to a display support system that includes a support stand having a connector, with the connector having a magnetic element configured to output a magnetic field, and a display. The display can include a housing having a connector portion configured to receive the connector of the support stand to attach the display to the support stand, a display screen positioned in the housing, and a magnetic sensor having an electrical property configured to change in response to a change in position of the connector of the support stand relative to the connector portion of the display housing.

The support stand can have a set of latches configured to hold the connector to the connector portion. An indicator can be included to output a signal in response to the connector of the support stand being attached to the connector portion of the housing. The indicator can be output via the display screen. The electrical property can be a voltage of the magnetic sensor, such as, for example, a voltage of a Hall effect sensor.

BRIEF DESCRIPTION OF THE DRAWINGS

The disclosure will be readily understood by the following detailed description in conjunction with the accompanying drawings, wherein like reference numerals designate like structural elements, and in which:

FIG. 8 shows a computer system of the present disclosure.

DETAILED DESCRIPTION

Figure 1A:
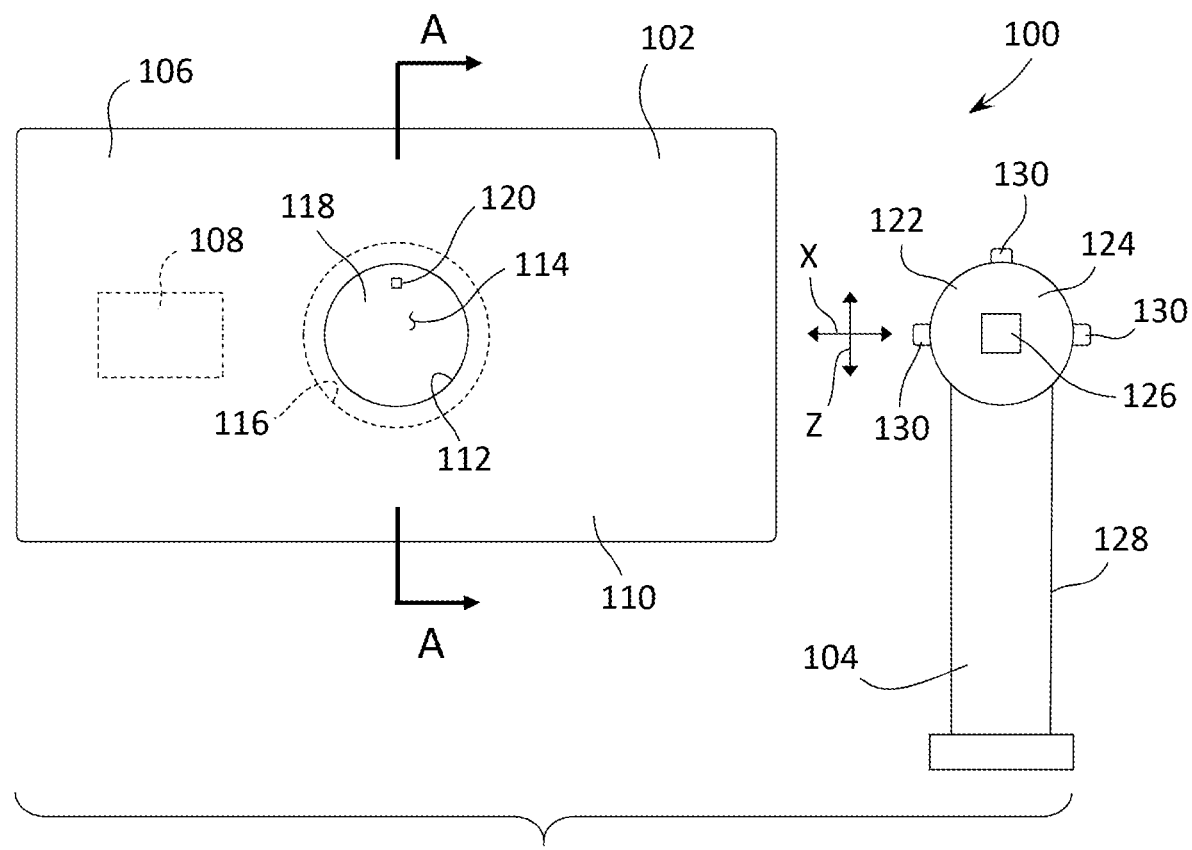
FIG. 1A shows a rear view of a display device and a front view of a support device.

Reference will now be made in detail to representative embodiments illustrated in the accompanying drawings. It should be understood that the following descriptions are not intended to limit the embodiments to one preferred embodiment. To the contrary, the present disclosure is intended to cover alternatives, modifications, and equivalents as can be included within the spirit and scope of the described embodiments as defined by the appended claims.

The present disclosure relates to a display device and display stand assembly that can help render use of the stand intuitive, secure, and robust. Traditional display stands comprise a top hook and spring latch or screw mount. Once assembled, the display can then rotate, relative to the stand, between landscape and portrait orientation. In either case, the user may be required to actively move a latch or apply a screw to attach the display to the stand, and these activities can only be performed from the rear side of the screen. This makes it difficult, if not impossible, for a user attempting to mount the display to the stand from the front of the display perform such operations. If the display stand or display are not movable to a position where the rear side of the display is accessible, the user is generally unable to mount the display.

Aspects of the present disclosure relate to an implementation of a display stand attachment system wherein a combination of magnetic features and latches work together to allow the display to be "blind" mounted to a mounting portion (e.g., a mount portion or "puck"-like portion) of a support stand or support arm. In other words, the user can hold the display from the viewing side of the display and can mount the display to the support without the mounting portion of the stand being visible and without having to awkwardly reach behind the display in order to secure the mounting portion to the display. In some embodiments, the user can quickly and easily "click in" the display to the mounting portion with a single horizontal movement of the display relative to the support arm on the stand and then let go without the display becoming disconnected from the mounting portion.

Magnets in the display and in the mounting portion of the support arm can guide and center the display relative to the mounting portion (or vice versa) to assist the user in inserting the mounting portion into a recess in the display. Thus, the magnets can reduce or eliminate the need for the user to see the location of the recess on the display relative to the mounting portion of the support arm due to magnetic attraction that guides the mounting portion to a receiving recess of the display. Additionally, by using magnetic sensors, the display can output information about the connection between the display and the support device.

A set of retractable latches of the mount portion can keep the display secured to the support arm once the two devices have been coupled. In this manner, the magnetic attachment between the display and the support arm can be less susceptible to being unmated when a relatively large moment or other inadvertent input force is applied to the display (e.g., the user pushes against a corner of the display or accidentally pulls on the edge of the display). The latches can be connected to a release mechanism to remove the display from the mount portion or to rotate the display relative to the mount portion. At least one of the latches can comprise a feature to prevent the display from unintentionally sliding off of the mount portion when the release mechanism is operated.

In some cases, the display and the support arm mount portion can be magnetically attracted to each other and may seem like they are mounted to each other while the orientation of the display relative to the mount portion is improper for secure support of the display. Such an instance and occur, for example, if the latches are not properly secured to hold the mount portion to the display, or an improper mount portion is being used (e.g., a mount portion is being used that is not designed for the weight or size of the display). In these cases, although the display may seem to be attached to the mount portion, the display can still be undesirably or incompletely supported by the mount portion, particularly in situations that push the connection between the support and the display to their limit, such as in situations where a high moment is applied to the display, when the display is moved quickly, when additional force is applied to the display that is unexpected, and in other similar situations.

Accordingly, aspects of the present disclosure relate to systems, methods, and devices that can be used to detect whether the display is properly and securely mounted to a mount portion of the support. These systems and devices can leverage the magnetic connection and the magnetic field output by the magnets in the display and/or support to determine the position of the display relative to the support and to determine whether the magnets being used to hold the display and the support to each other are within defined specifications of strength and positioning on the display or support. When an improper mount between a display and support is detected, systems and methods described herein can include alerting a user to correct the improper mount, to move the display relative to the mount in some way, or to use a different support. When a proper mount is detected, the systems and methods can include alerting a user that the mounting was successful or proper, providing other instructions to a user (e.g., how to remove the display from the support), or taking no action, thereby allowing the user to go on using the display without interruption. Accordingly, embodiments of the present disclosure include ways to alert and inform users regarding the safety and security of attachment of displays to supports, to ensure that proper equipment is used in conjunction with each other, and to ensure that users are aware of potential risks to the products and their surroundings.

In one example embodiment, a support system for electronic device is provided. The support system can comprise a housing structure with a support connector portion configured to magnetically couple the housing structure to a support device, an electronic circuit connected to the housing structure, and a Hall effect sensor connected to the housing structure and in electronic communication with the electronic circuit. The Hall effect sensor can output a signal to the electronic circuit based on a magnetic field sensed from the support connector portion or from the support device. For example, the Hall effect sensor can have an output voltage that changes in response to the magnetic field in which it is positioned, and the output voltage can be indicated by a signal generated by a circuit including the Hall effect sensor. The Hall effect sensor can, therefore, be used to sense whether a mount portion of the support device is coupled to the support connector portion of the housing structure. Additionally, the Hall effect sensor can be designed and implemented with proper sensitivity and with proper positioning on or in the housing structure to determine whether a particular type or orientation of magnetic element is being used with the support device, thereby allowing the electronic circuit to detect whether a proper support device is being used with the electronic device. If an improper device is detected, the electronic circuit can output a signal to alert a user that the support device is improper.

Additionally, in some cases, the electronic circuit can be configured to output a graphic or visual indicator on a display while the user is moving the display relative to a support device. The graphic or visual indicator can provide spatial information, movement recommendations, and alerts to the user while they are holding the sides of the display and moving it relative to the support device. For example, the output of at least one Hall effect sensor can be used to detect a distance between the support device and the Hall effect sensor, and that distance can be shown or represented on the display to help the user determine how far he or she needs to move the display before it attaches to the support device at the support connector portion. In another example, the output of the Hall effect sensor can be used to determine a vector quantity indicating the positioning of the display support connector portion relative to the support device (i.e., its distance and direction from the support connector portion), and the vector quantity can be used to produce a graphic or visual indicator instructing the user to move the display in a certain direction (e.g., left, right, up, down, forward, backward, or through a rotation) in order to orient the display properly relative to the support device and to make a secure connection.

Furthermore, in some embodiments, the Hall effect sensor can be used to determine the orientation of the display or housing structure relative to the support device, and output of the display or other connected device can be adjusted accordingly. For example, if the user is attaching the housing structure in a landscape orientation, output of the display can be configured to be shown in a landscape orientation, and if the user is attaching the housing structure in a portrait orientation, output of the display can be rotated or otherwise altered relative to the landscape orientation to be shown in a portrait orientation. The Hall effect sensor can also be used to track other types of movements of a display relative to a support device. Thus, systems herein can include detecting an output of a magnetic sensor of a display device in the presence of a magnetic field, determining an orientation of the display device based on the output of the magnetic sensor, and controlling output of the display device based on the determined orientation, such as by rotating images on the display to remain upright as the display device rotates to different orientations.

In order for the Hall effect sensor to detect the magnetic field of the support device and to determine whether a support device is properly connected to the display device, a set of detection bands or ranges of acceptable magnetic flux measurements can be referenced. The bands or ranges can correspond to voltage outputs of the Hall effect sensor that correspond to magnetic flux measurements of a properly oriented and attached support device. Thus, when the Hall effect sensor outputs the proper voltage within that range, the connected electronic device or computing device can determine that the display or housing is attached to the support device and that the support device is a correct type of support device for the display or housing.

These and other embodiments are discussed below with reference to the figures. However, those skilled in the art will readily appreciate that the detailed description given herein with respect to these figures is for explanatory purposes only and should not be construed as limiting.

FIGS. 1A-1D illustrate various views of a support system 100 of the present disclosure. The support system 100 can include a display device 102 and a support device 104. The display device 102 can be configured to attach to the support device 104 so that the support device 104 holds or suspends the display device 102 away from a support surface on which the support device is positioned.

In various embodiments, the display device 102 can comprise a display screen (e.g., a liquid crystal display (LCD), light emitting diode (LED) display, matrix display, or other visual output device), such as a monitor or display for a computing device such as a personal computer, a laptop or notebook computer, a server, a mobile computing device (e.g., a tablet computer, smartphone, or e-reader), similar devices, and combinations thereof. In some cases, the display device 102 can be a computing device such as a tablet computer or smart phone, and the tablet computer or smart phone can be mounted to the support device 104. Additionally, the display device 102 can instead simply be a housing or other structural component of another device, such as a housing structure of a computer tower, a stand (e.g., an easel for music or painting), a loudspeaker, an input device, or another device that does not have its own display for output. Thus, although a display screen is generally referenced in the present disclosure, it will be understood that various different kinds of devices can be supported by the support device and can have connection features to the support device similar to the support connection portions and other features described in connection with the display device 102. In this manner, systems of the present disclosure relate to magnetic attachment of any electronic device to a support device, and display devices are discussed herein as an example embodiment of those electronic devices.

Similarly, although the support device 104 is shown as an adjustable stand for holding a display on top of a flat support surface, it should be understood that the support device 104 can comprise a support arm, an articulating bar, a VESA mount attachment, or other support device configured to interact with the support connection features of the display device 102. For instance, the support device 104 can be a different type of attachment that uses magnets and/or latches to connect to the display device 102, even if a generally puck-shaped mounting portion and the pictured number of latches are not used with the attachment. Furthermore, although the embodiments shown herein have a mating arrangement wherein the support device is insertable into the display device, it will be understood by those having skill in the art that a reversed arrangement is possible, wherein the display device has a portion insertable into the support device. Furthermore, although magnetic elements are described as being positioned on the support device and magnetic sensors are described as being part of the display device, it will also be understood that those elements can have their positions reversed.

Figure 1B:
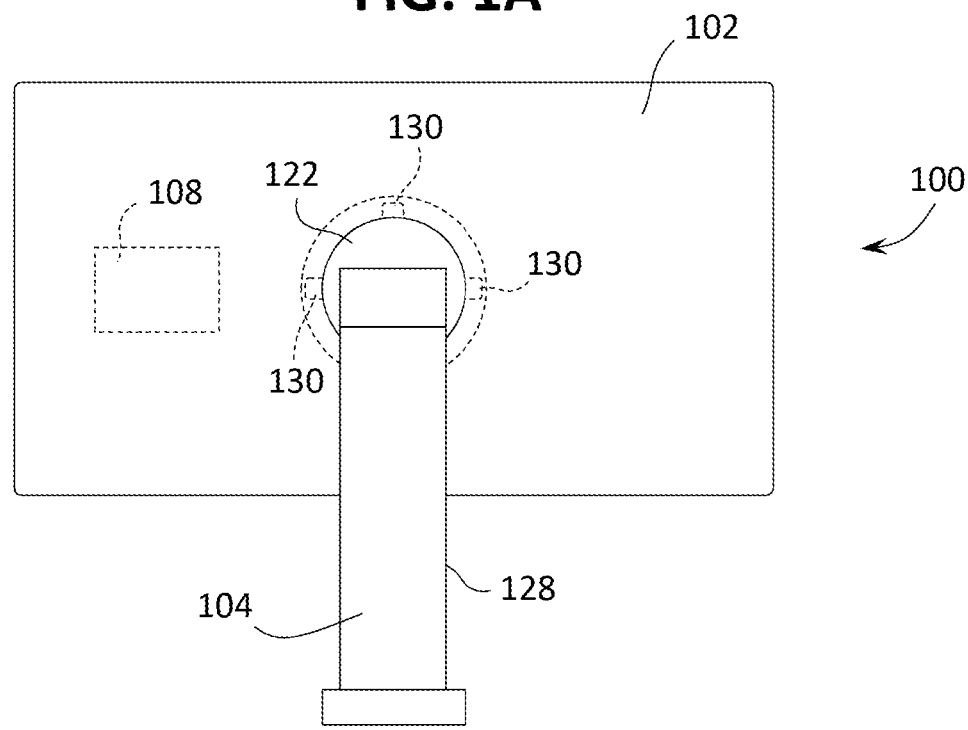
FIG. 1B shows a rear view of the display device and the support device in a different relative configuration.
Figure 1C:
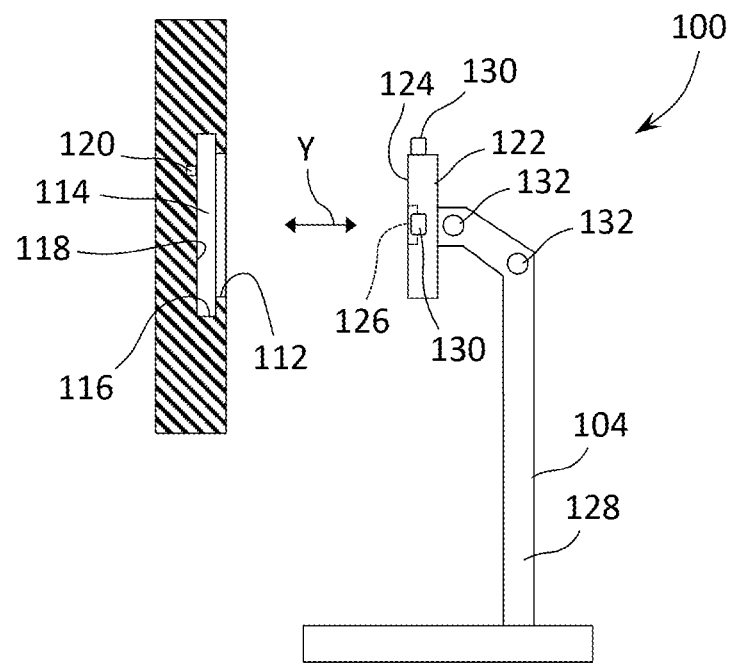
FIG. 1C shows a section view of the display device of FIG. 1A as taken through section lines A-A in FIG. 1A and a left side view of the support device of FIG. 1B.
Figure 1D:
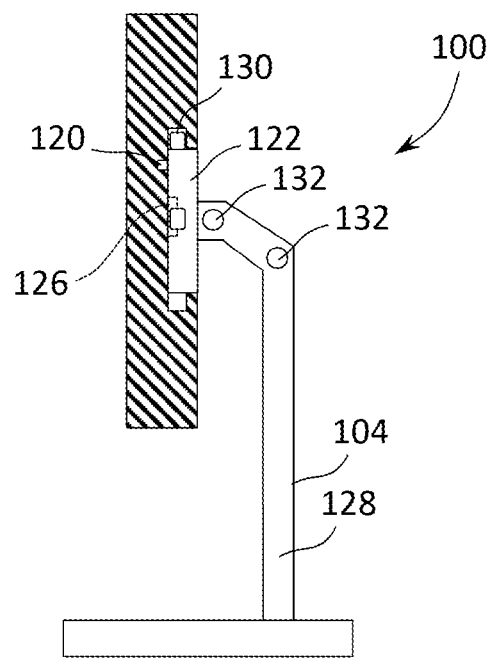
FIG. 1D shows the section view of FIG. 1C with the support device connected to the display device.

The display device 102 can comprise a housing 106 or enclosure with walls and similar structures configured to house, enclose, support, and/or protect electronic devices (e.g., electronic device 108). The display device 102 can have an associated orientation, wherein the width and height dimensions of the display device 102 are different. The display device 102 has a landscape orientation in which the greater dimension is horizontal and has a portrait orientation in which the greater dimension is vertical. In some embodiments, the display device 102 can be pivoted or rotated between the landscape and portrait orientations to provide a user or viewer with alternative ways to display information using the display device 102. FIGS. 1A and 1B show rear views of the display device 102, and FIGS. 1C and 1D show simplified side section views of the display device 102 as taken through section lines A-A in FIG. 1A.

A rear surface 110 of the housing 106 can comprise a rear opening 112 that opens into a recess 114 within the display device 102. A radial inner surface 116 of the recess 114 can be wider than the rear opening 112 in order to receive and latch against latches of the support device 104, as illustrated in FIGS. 1B and 1D. An inner surface 118 of the recess 114 can comprise a magnetic element, such as, for example, a permanent magnet, electromagnet, or a ferromagnetic material that is attracted to, or attracts, the mount portion (e.g., 322) of the support device 104. In some embodiments, the rear opening 112 and recess 114 can have a substantially circular shape to permit rotation of the display device 102 relative to the support device 104 while the display device 102 and support device 104 are mounted to each other.

In some embodiments, at least one magnetic sensor, such as a Hall effect sensor 120, can be positioned in the recess 114 or near the recess 114 in or on the housing 106. The Hall effect sensor 120 can be in electronic communication with electronic device 108 or with another external computing or electronic device that is remotely connected to the display device 102. The Hall effect sensor 120 can output a voltage (or can cause a voltage drop or other electrical signal) based on a magnetic field being in its vicinity, such as by outputting a voltage corresponding to a sensed magnetic field from a nearby magnet, such as a magnet of the support device 104. Signals output by the Hall effect sensor 120 can be received by the electronic device 108 or other connected device and can be used to determine whether the display device 102 is properly and securely connected to a proper support device 104.

FIG. 1A shows a front view of the support device 104, thereby showing a mount portion 122 having a front surface 124 configured to be inserted into the recess 114 of the display device 102 and come into contact with the inner surface 118. The mount portion 122 can include a magnetic element 126, such as a permanent magnet, electromagnetic, or ferromagnetic material that is magnetically attracted by, or attracts, magnetic elements in the display device 102. Thus, a magnetic attraction between the mount portion 122 in the housing 106 can secure and hold the display device 102 to the support device 104. The support device 104 can also include a stand or base 128 to suspend the mount portion 122 away from a support surface below the base 128.

FIGS. 1A and 1C also show that the display device 102 and the support device 104 can be separate from each other, wherein the mount portion 122 is not positioned within the recess 114. FIG. 1A shows that the mount portion 122 can be spaced away from the recess 114 in horizontal and vertical directions, as indicated by axes X and Z in FIG. 1A. The mount portion 122 can be movable relative to the display device 102 along axes parallel to axes X and Z. FIG. 1C similarly shows that the display device 102 can be spaced away from the mount portion 122 along axis Y, and the mount portion 122 can be movable relative to the display device 102 along an axis parallel to axis Y.

For example, a user can place the support device 104 on a support surface and can hold the display device 102 in his or her hands to move the display device 102 relative to the mount portion 122. By moving the display device 102 in directions generally along arrows X, Y, and Z, the user can change the position of the recess 114 relative to the mount portion 122 and can thereby bring the recess 114 to move against and receive the mount portion 122. As the mount portion 122 is inserted into the rear opening 112, a set of spring-loaded latches 130 extending radially from the mount portion can retract radially inward until the mount portion 122 is fully inserted into the recess, and the spring-loaded latches 130 can spring radially outward toward the radial inner surface 116, as shown in FIGS. 1B and 1D.

FIG. 1B shows a rear view of the display device 102 and a rear view of the support device 104. In FIG. 1B, the support device has the mount portion 122 inserted into the recess 114 of the display device 102. Accordingly, the display device 102 can be said to be mounted to the support device 104. This is state is shown in side profile in FIG. 1D. As shown in FIGS. 1C and 1D, the support device 104 can comprise joints 132 or other types of articulatable segments that are adjustable, enabling a user to change the position of the display device 102 relative to a support surface after mounting to the mount portion 122.

Figure 2:
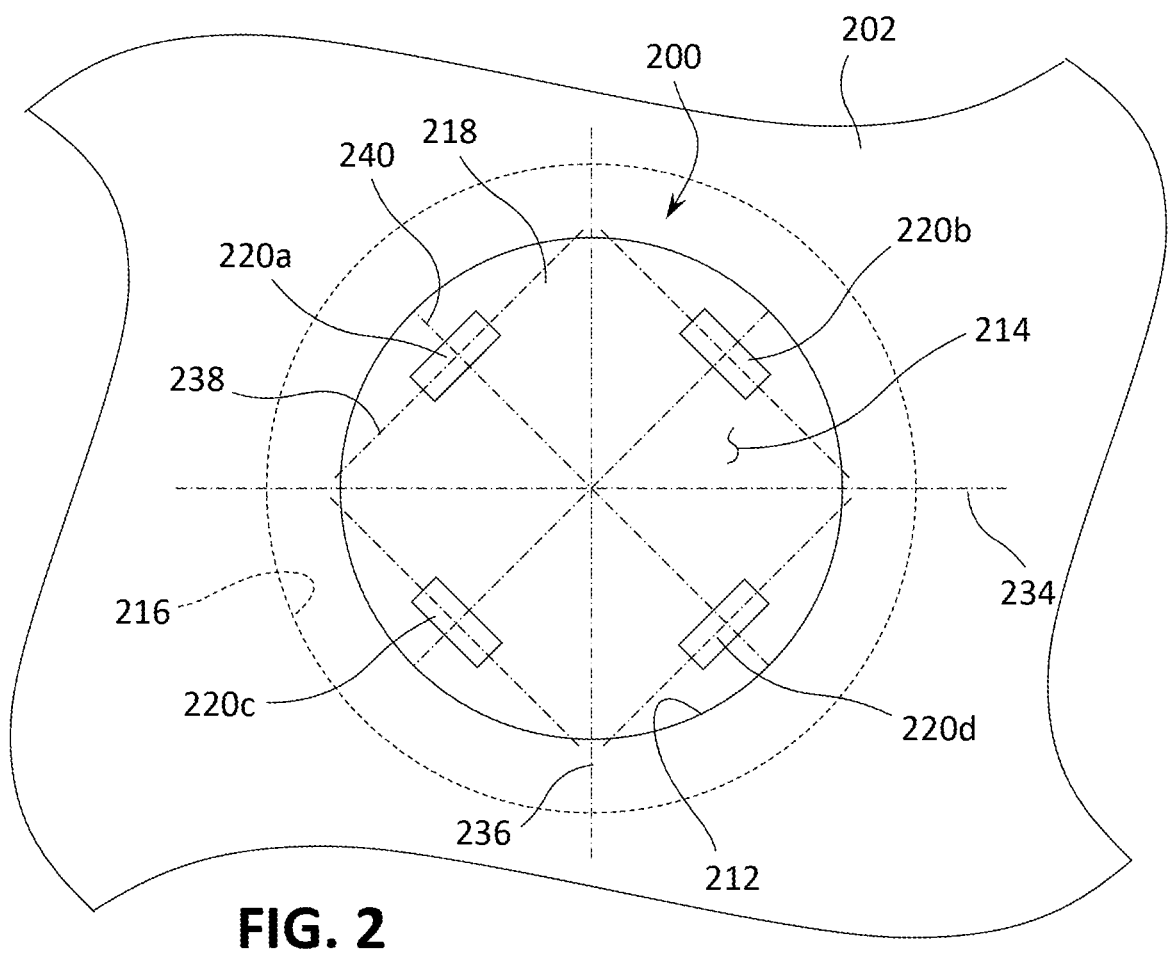
FIG. 2 is a detail of the rear view of a support connector portion of a display device.

FIG. 2 is an enlarged detail rear view of a support connector portion 200 of a display device 202 according to an embodiment of the present disclosure. The display device 202 can be an embodiment of the display device 102. Accordingly, reference numbering for display device 202 corresponds to numbering for display device 102. The support connector portion 200 of display device 202 comprises a set of four magnetic sensors 220a-220d circumferentially spaced apart around an inner surface 218 of the recess 214. In some embodiments, the inner surface 218 can be on a rear wall of a housing portion comprising a ferromagnetic material, such as steel, iron, and similar metals configured to be attracted to magnets in a support device.

The magnetic sensors 220a-220d can be Hall effect sensors configured to sense a magnetic field from magnets (e.g., 126) of a mount portion (e.g., 122) of a support device (e.g., 104). See also magnetic elements 326a-326d in FIG. 3. In some embodiments, other types of magnetic sensors known in the art can be used. The magnetic sensors 220a-220d can be configured to output a signal based the magnitude of a magnetic field in the area. In some embodiments, the magnetic sensors 220a-220d can be spaced at positions 45-degrees offset from a horizontal centerline 234 and a vertical centerline 236 of the support connector portion 200. Thus, the magnetic sensors 220a-220d can be referred to as being positioned at 135 degrees, 45 degrees, minus 135 degrees, and minus 45 degrees relative to the right side of the horizontal centerline 234.

The magnetic sensors 220a-220d can also have individual orientations, wherein their primary axes (e.g., 238) extend longitudinally through their shapes shown in FIG. 2. Thus, in this view, their primary axes intersect to form a square having corners on the horizontal and vertical centerlines 234, 236. The magnetic sensors 220a-220d can also have minor axes (e.g., 240) that extend perpendicular to their primary axes and that intersect at the center of the support connector portion 200. As explained in further detail below, the orientations of the magnetic sensors 220a-220d can affect their output signals and measurement sensitivity when magnetic elements of the support device are positioned nearby. The orientations and positions of the magnetic sensors 220a-220d shown in FIG. 2 have optimized sensitivity for the X- and Z-directions shown in FIG. 1A.

Although FIG. 2 shows four magnetic sensors 220a-220d positioned in four quadrants of the support connector portion 200, any number of magnetic sensors can be used, such as one magnetic sensor (e.g., 120), two magnetic sensors, three magnetic sensors, five magnetic sensors, or more. The magnetic sensors 220 can be evenly spaced apart or irregularly spaced. Each of the magnetic sensors 220a-220d can output their own signal when a magnetic field is detected, so the number of magnetic sensors implemented in the support connector portion 200 can affect the amount of sensor information obtainable from the support connector portion 200 by a connected electronic device (e.g., 108 or an external computing device).

Figure 3:
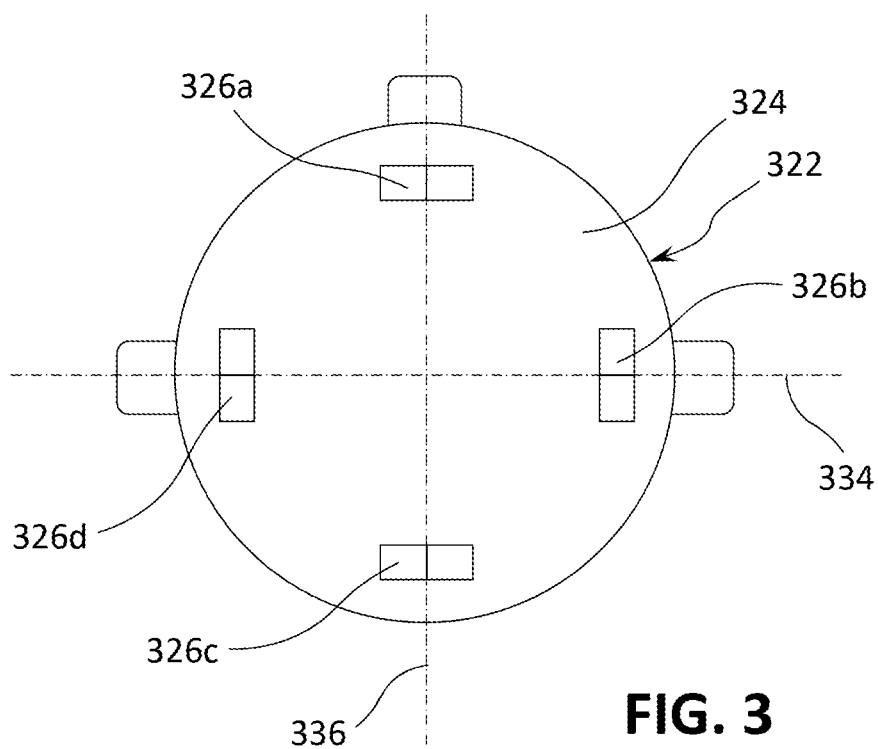
FIG. 3 shows a front view of a mount portion of a support device.

FIG. 3 illustrates a schematic front view of a front surface 324 of a mount portion 322 of a support device of the present disclosure. The front surface 324 can be generally circular and flat, and the mount portion 322 can be generally cylindrical. The mount portion 322 can be used as (or correspond to) the mount portion 122 of FIGS. 1A-1D. Accordingly, the mount portion 322 can be configured to be inserted through the rear opening 212 and into the recess 214 of the support connector portion 200 of FIG. 2.

The mount portion 322 can include a set of four magnetic elements 326a-326d distributed and circumferentially spaced around the mount portion 322 at 90-degree increments. Accordingly, the magnetic elements 326b and 326d are positioned along the horizontal centerline 334, and the magnetic elements 326a and 326c are positioned along the vertical centerline 336. The magnetic elements 326 are therefore rotationally offset from the magnetic sensors 220 by about 45 degrees when the mount portion 322 is inserted into the recess 214 in the orientations shown in FIGS. 2 and 3. Although FIG. 3 shows four magnetic elements 326a-326d that are evenly spaced apart, in some embodiments more or fewer magnetic elements can be used, and the magnetic elements may not be evenly spaced apart on the mount portion 322.

Figure 4A:
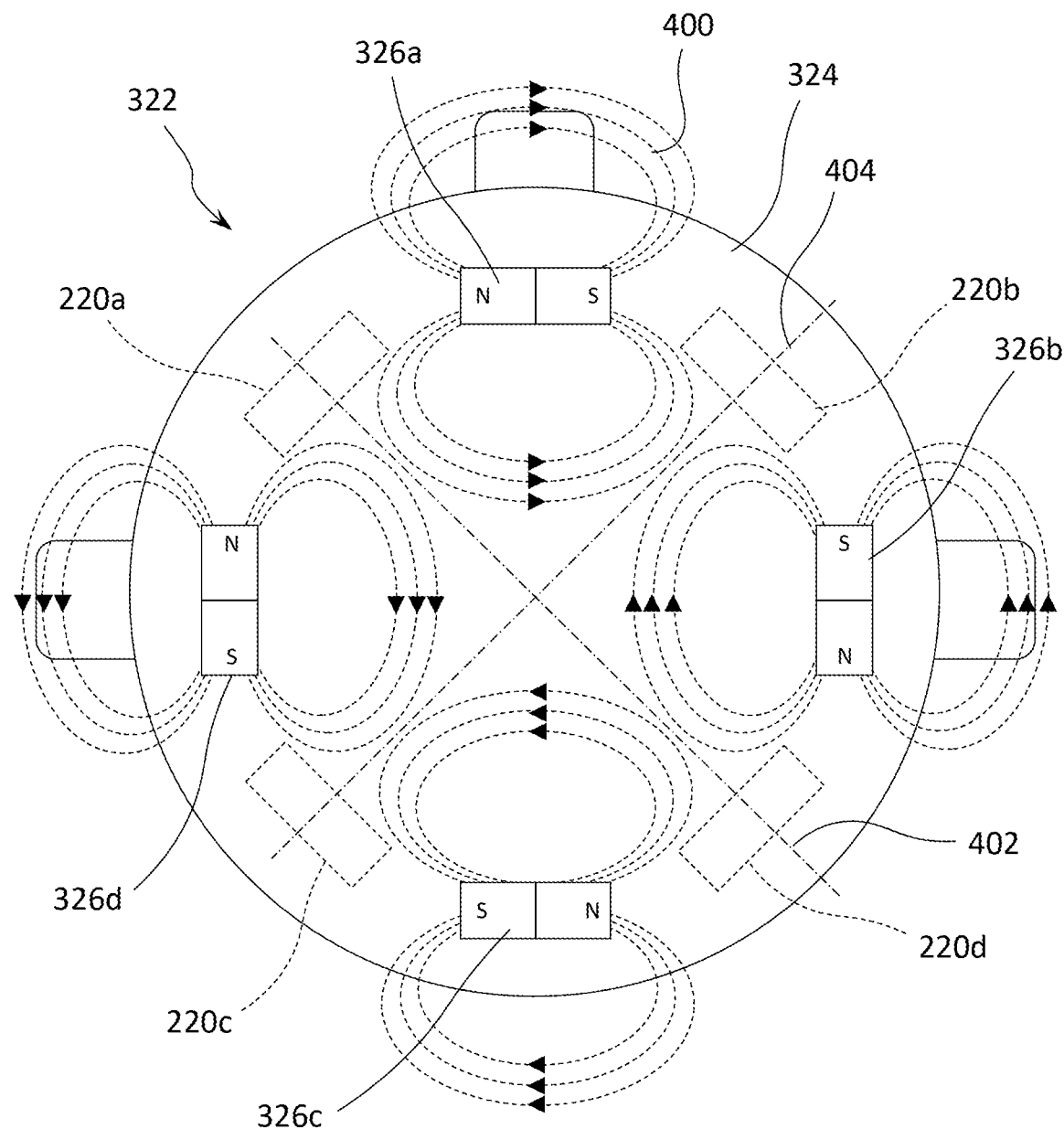
FIG. 4A shows a front view of the mount portion of FIG. 3 with magnetic sensors of a support connector portion overlaid.

FIG. 4A shows an enlarged rear view of the mount portion 322 showing an example polarity configuration for each of the magnetic elements 326a-326d and schematically showing a magnetic field (e.g., 400) for each magnetic element 326. As suggested by the magnetic fields, each of the magnetic elements 326 have substantially equal strength, but the polarities and orientations of each aligned magnetic element 326a/326c and 326b/326d differ from each other.

The magnetic fields of each magnetic element 326 generate a flux through each of the magnetic sensors 220a-220d of the display device 202. For reference, the magnetic sensors 220a-220d are shown superimposed (shown in dashed lines) on the front surface 324 of FIG. 4A. Accordingly, in this configuration, the composite magnetic forces applied at magnetic sensors 220a and 220d are oriented substantially radially inward along axis 402, and the composite magnetic forces applied at magnetic sensors 220b and 220c are oriented substantially radially outward along axis 404. With magnetic elements 326 that are substantially equal in magnetic strength and size and that are equally spaced from the magnetic sensors 220, the magnitude of the magnetic flux through the magnetic sensors 220 can be substantially the same in each sensor. Accordingly, a magnitude of the voltage signals output by each magnetic sensor 220 can be substantially the same when the mount portion 322 is aligned and centered with regard to the aggregate magnetic sensors 220 or recess 214.

Figure 4B:
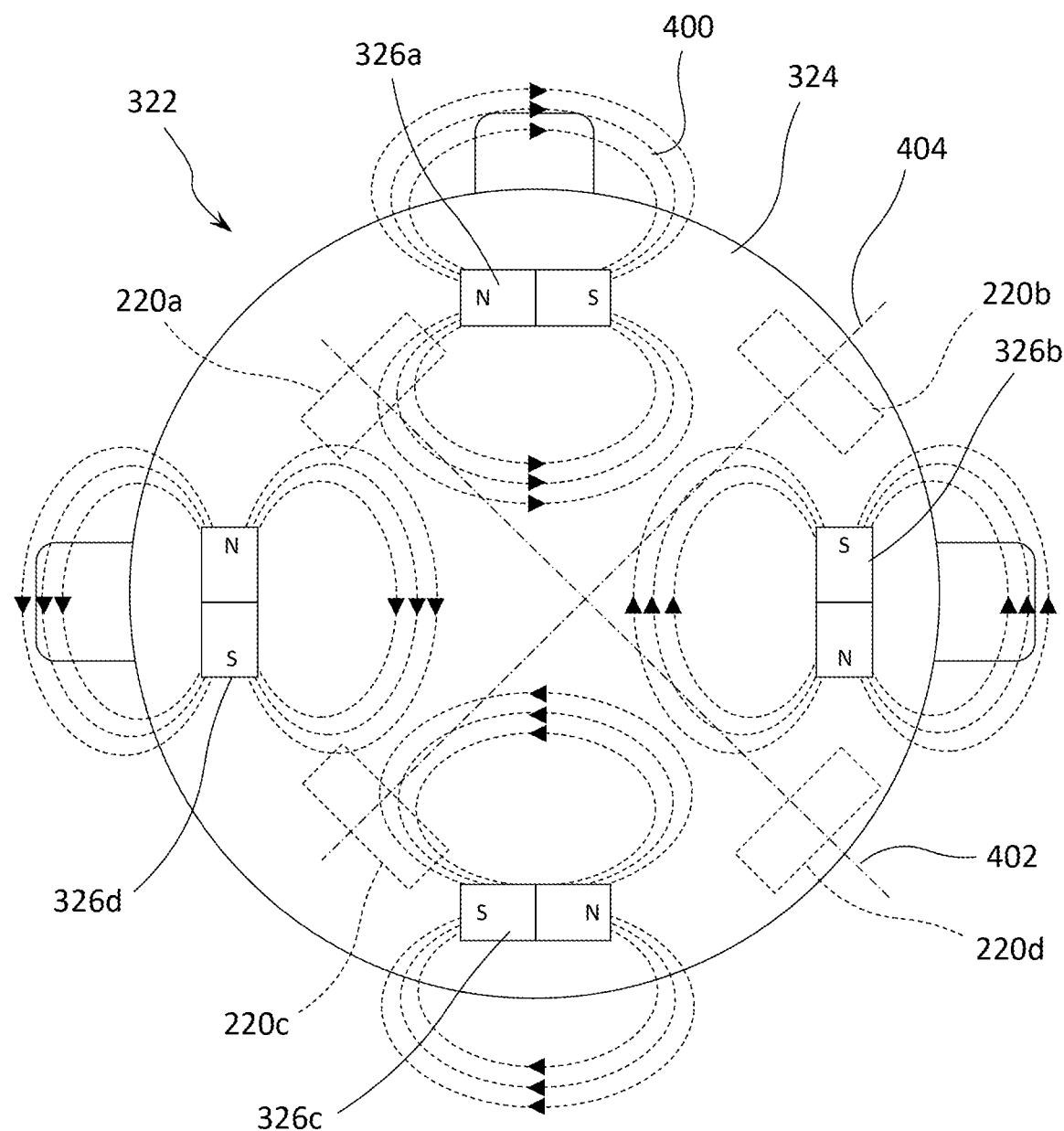
FIG. 4B shows the front view of the mount portion of FIG. 3 with magnetic sensors of the support connector portion overlaid in a different position.

FIG. 4B shows an example in which the magnetic sensors 220 are not collectively centered around the center point of the front surface 324 of the mount portion 322, such as when the mount portion 322 is not seated in recess 214 (e.g., when a user is trying to position the display device relative to the support device for mounting thereon). In this case, each of the magnetic sensors 220a-220d will be under a different magnetic flux and in magnetic fields having different magnitudes and directions. For example, magnetic sensors 220a and 220c are closer to magnetic elements 326a and 326c and therefore experience a stronger magnetic field as compared to their positions in FIG. 4A and as compared to the magnetic fields experienced by magnetic sensors 220b and 220d in FIG. 4B. This would result in one or more of the magnetic elements 326a-326d outputting a signal representative of an unacceptable positioning of the magnetic elements 326a-326d relative to the magnetic sensors 220a-d, and thus, an improper positioning of the display device relative to the support device.

Accordingly, in one embodiment of the present disclosure, an electronic device (e.g., 108) receiving signals from the magnetic sensors 220 can be configured to output a signal indicating an acceptable mounting of the mount portion 322 to display device 202 when the signals from each of the magnetic sensors 220 are identical or are indicative of the magnetic sensors 220 being positioned in magnetic fields with equal strengths.

In an example of such an embodiment, the magnetic sensors 220a-d can be arranged in a first pattern, and the magnetic elements 326a-d can be arranged in a second pattern such that when the display device is mounted to the support device (e.g., represented in FIG. 4A), the superimposition of the first pattern over the second pattern results in the sensors 220a-d being interposed between the magnets 326a-d (e.g., sensor 220a is interposed between magnets 326a and 326d).

In some embodiments, other, non-equal values can be used as the values at which the magnetic sensors 220 are determined to be positioned properly relative to the mount portion 322. Thus, the sensors 220 and/or the magnetic elements 326 need not be arranged in a symmetrical pattern. Rather, a variety of patterns, orientations and spatial relationships may be established so long as a proper range of magnetic flux is established to be experienced by each individual sensor 220a-d. In other words, it may be expected that sensor 220a will experience a first magnetic flux, and that sensor 220b will experience a second magnetic flux, different from that experienced by sensor 220a. When each sensor experiences the predetermined range of flux set for the individual sensor 220a-d (such as described below), the display device can be determined to be in an acceptable mounting position.

Figure 5A:
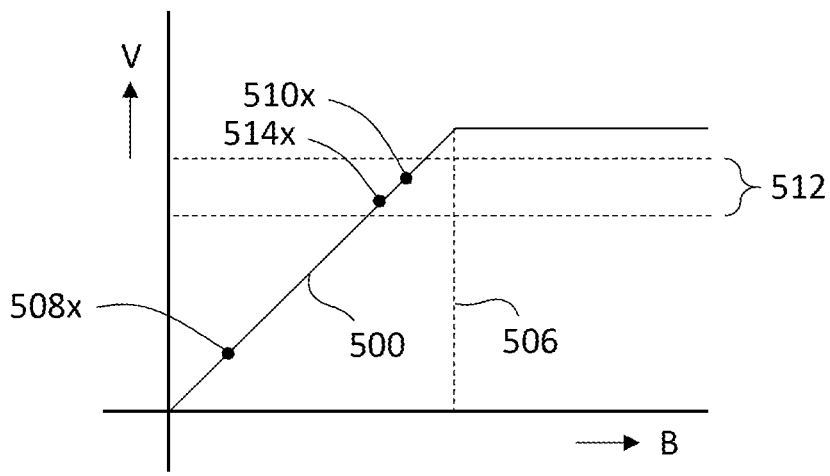
FIGS. 5A-5C show charts of sensor output as a function of magnetic field strength.
Figure 5B:
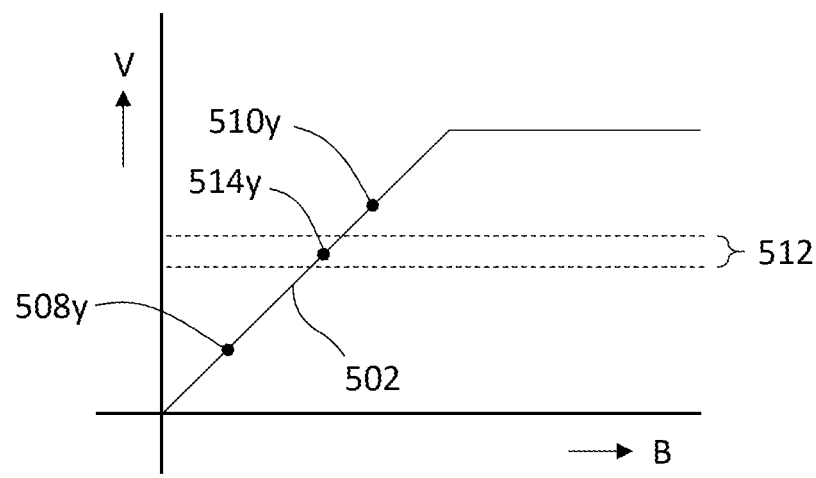
Figure 5C:
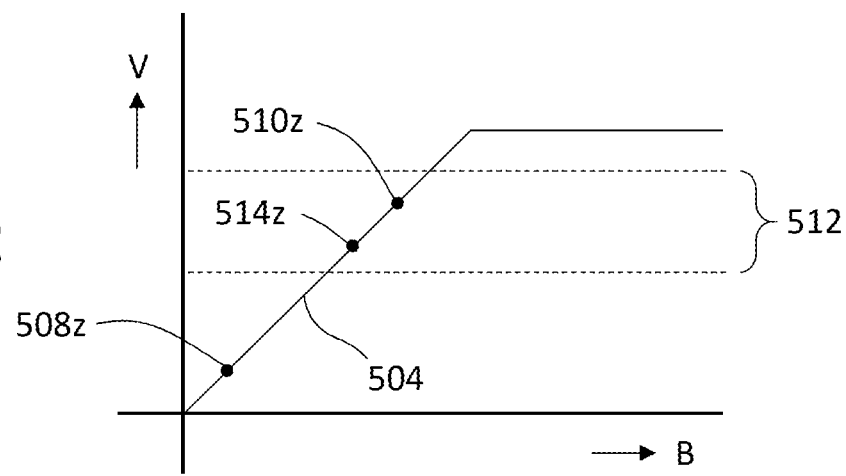

FIGS. 5A-5C show a set of charts showing output curves 500, 502, 504 (each in volts (V)) of a magnetic sensor 220, such as a Hall effect sensor, based on magnetic field strength or flux (B) experienced by the magnetic sensor 220. Each output curve 500, 502, 504 indicates a magnetic sensor output signal along one of the three cardinal directions X, Y, and Z. Thus, output curve 500 indicates voltage corresponding to the flux along the X-axis at the magnetic sensor, and output curves 502 and 504 indicate voltages corresponding to the flux oriented parallel to the Y- and Z-axes, respectively.

Figure 6:
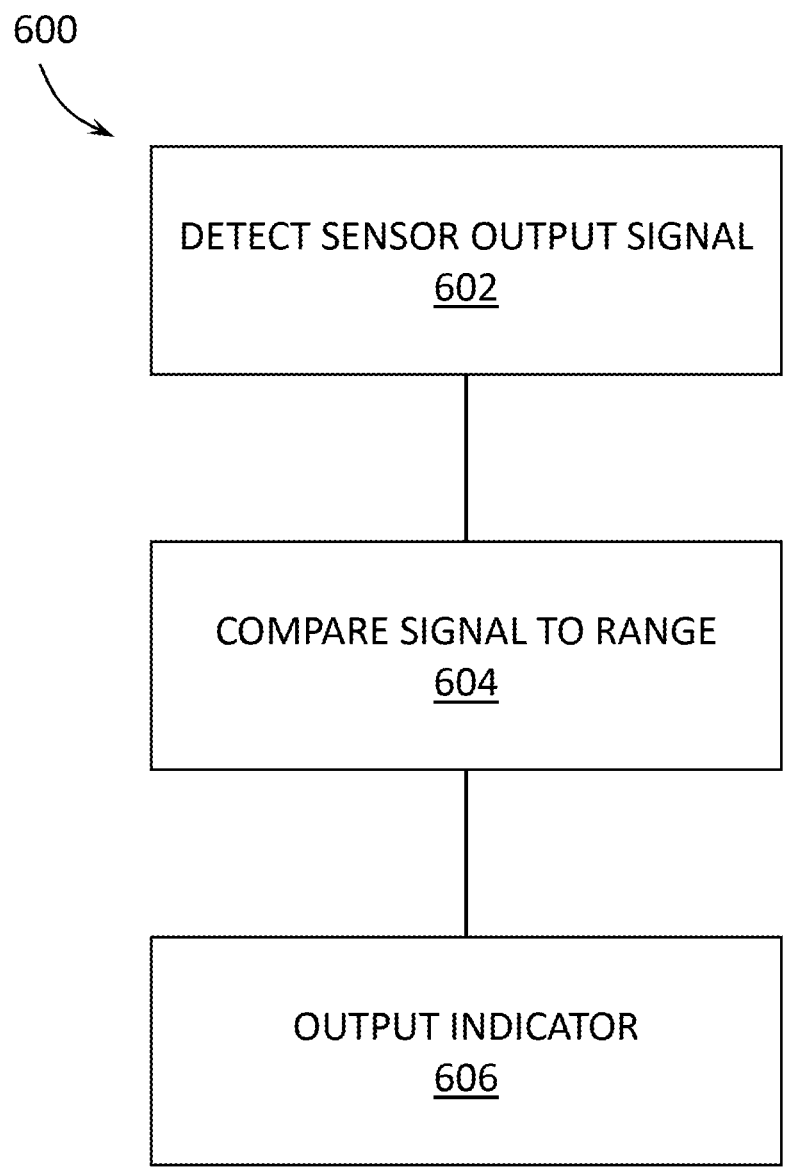
FIG. 6 is a process diagram of a method of the present disclosure.

FIG. 6 shows a process chart for a method 600 of the present disclosure. The method 600 can be executed by a controller or computing device and can use information shown in the charts of FIGS. 5A-5C to determine and produce an output. The output produced can indicate whether the support device is properly connected to the display device (or whether the support device is an approved support device) and/or provide information about how to adjust the display device or support device to achieve a proper connection.

The method 600 can include detecting or receiving a sensor output signal, as shown in block 602. The output curves 500, 502, 504 of FIGS. 5A-5C show the voltage response of the magnetic sensor 220 as a function of the magnetic field strength B. Thus, as magnetic elements (e.g., 326) and magnetic sensor 220 move relative to each other in three dimensions, the voltage output from the magnetic sensor 220 varies along the output curves 500, 502, 504 according to their respective dimensions. For low values of B, the voltage V increases proportional to the flux in a linear manner. Once the flux B exceeds a predetermined flux magnitude 506, the magnetic sensor 220 is no longer sensitive to changes in the flux B. In some embodiments, a single voltage output V is provided from a sensor after that reading.

Therefore, in an example embodiment, a magnetic sensor 220a can provide a voltage output at 508x, 508y, 508z when the mount portion 322 is at a first distance relative to a first direction from the magnetic sensor 220a. The composite magnetic field emitted by the magnetic elements 326a-326d can cause a single voltage output by the magnetic sensor 220a on each output curve 500, 502, 504. As the mount portion 322 moves relative to the magnetic sensor 220a, the output of the sensor can accordingly change. For a second distance and a second direction from the magnetic sensor 220a, a second voltage output 510x, 510y, 510z can be provided. The voltage outputs 510 have greater magnitude than the voltage outputs 508, so the controller can determine that the mount portion 322 is closer to the magnetic sensor 220a in all three directions because the flux B has also increased.

The method 600 can further comprise comparing the sensor output signal to a range of values, as indicated in block 604. For instance, each voltage output 500, 502, 504 can have a corresponding range 512 (i.e., a predetermined threshold band or trigger band) within which the reading of the magnetic sensor 220 should lie when the mount portion 322 and the sensor 220 are in the correct, mounted, and attached position relative to each other (i.e., in the position of FIG. 1B). Thus, when the voltage outputs of the magnetic sensor 220 are all within the ranges 512, the electronic device/controller can determine that the display device is positioned properly on the support mount. For the first position corresponding to outputs 508x, 508y, and 508z, the outputs are not within the ranges 512 for any directions, so the controller can determine that the display device is not attached to the support mount or that it is not properly positioned relative to the mount portion 322 along any of the three primary axes X, Y, and Z.

Therefore, depending on the comparison of the signal to the range in block 604, the method 600 can include outputting an indicator, as shown in block 606, and the indicator can be a signal indicating whether the sensed magnetic field is within the range 512 or not. For the second position corresponding to outputs 510x, 510y, and 510z, the controller can determine that the outputs 510x and 510z are within the acceptable ranges 512 for the output curves 500, 504 of the X- and Z-directions, respectively, but that output 510y is not within the acceptable range 512 for output curve 502. Accordingly, the controller can determine that the display device is acceptably positioned relative to the X- and Z-directions, but not properly positioned relative to the Y-direction. In some embodiments, the controller can therefore produce an indicator signal indicating that the mount portion 322 is not properly positioned, that it is not properly positioned in the Y direction, and/or that it is properly positioned in the X and Z directions.

When all three outputs (e.g., 514x, 514y, 514z) are within their respective acceptable ranges 512, the controller can determine that the mount portion 322 is properly positioned and that the proper mount portion 322 is being used. Thus, the output indicator of block 606 can indicate that the mount portion 322 is a proper one and that it is being used properly.

In some embodiments, a user may attempt to use a different support mount or a support mount that is not designed for use with the display device. For example, the support mount may have magnetic elements that are positioned in different places than expected, may have magnetic elements that are greater in strength or number that expected, may have a housing or plate that absorbs or redirects magnetic field differently than a proper mount portion, or may otherwise output a different magnetic field. Thus, the voltage outputs along the output curves 500, 502, 504 can lie outside the acceptable ranges 512 for one or more directions, and the controller can determine that the mounting is improper, even if the different mount portion used is completely attached to the display device. This improper output notice can be beneficial because display devices can appear to be attached to support devices securely, but, if the support device is not well-designed or does not account for certain types of uses of the display device, the connection between the display device and the support device can be broken or interrupted unexpectedly, thereby risking damage to the display device, the support device, and their surroundings.

In some embodiments, the ranges 512 can be different for each magnetic sensor 220a-220d. In other cases, the ranges 512 can be the same for each sensor. The controller can thereby ensure that each sensor 220 recognizes that the magnetic field has an acceptable strength in all three primary directions (X, Y, and Z) for all of the sensors 220. Accordingly, the sensors 220 can be used collectively to determine whether the mount portion 322 is properly attached to the support connector portion 200 of the display device 202. Additionally, in some embodiments, the magnetic sensors 220 can be configured to have higher tolerance for variation in the magnetic field measurements for one or more directions. As shown in FIGS. 5A-5C, for example, the range 512 of FIG. 5B is narrower than the range 512 in FIG. 5C, thereby indicating that there is less variation permitted in the flux B through the Y-direction for that sensor 220 than for variation in the Z-direction. In this manner, the system can allow for minor movements, rotations, or other shifts of the display device relative to the mount portion without indicating an improper connection. Furthermore, different magnetic elements can be used in different types of acceptable mount portions, and the various different mount portions can all be permitted and recognized as proper mounts as long as they all produce voltages within the ranges 512 since the sufficient voltages correspond with sufficient magnet strength to secure the mount portions to the display device.

Additionally, the ranges 512 can be designed for each mount portion to have a lower boundary or lower limit that is sufficiently high enough to filter out magnetic "noise" around the display device and can also have an upper boundary or upper limit that is less than the voltage at the predetermined flux magnitude 506. If the upper boundary is set too high, overly strong magnets (which could be unacceptably difficult to remove from the display device or could cause damage to sensitive electronic components (e.g., electronic device 108)) could be recognized as being proper. Furthermore, if the magnetic sensor 220 is overloaded by a magnetic field that is at or beyond the predetermined flux magnitude 506, the overload of the sensor can inhibit its ability to sense changes in flux in other directions. For example, if the flux is too strong in the Y-direction, the sensor can lose sensitivity or be easily overloaded in the X- and Z-directions as well. Thus, in some embodiments, such as in the embodiments of FIGS. 2-4B, the magnetic sensors 220 are positioned rotationally offset from the magnetic elements 326 in order to help improve their measurement sensitivity along the X- and Z-directions by ensuring that a magnetic field in the Y-direction (shown in FIG. 1C) does not overload the sensors 220 due to the magnetic elements 326 being too close to the sensors 220. Accordingly, in some embodiments, the magnetic sensors 220 can be configured to be out of alignment with or spaced away from the magnetic elements 326 in multiple directions. For example, as shown in FIG. 4A, the sensors 220 are spaced away from the magnetic elements 326 in the X- and Z-directions, and the sensors 220 are also not aligned (or in the same plane) with the magnetic elements 326 in the Y-direction (even if they are relatively closer to the magnetic elements 326 in the Y-direction than in the X- and Z-directions).

Figure 7A:
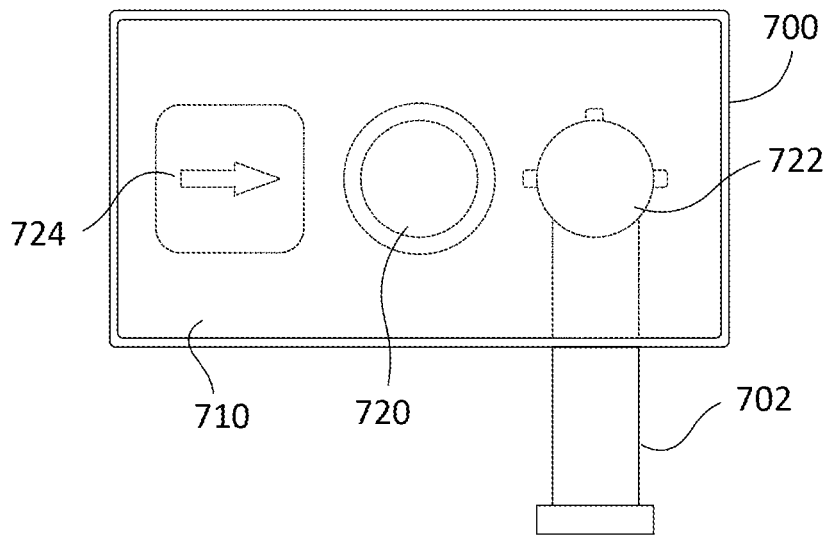
FIGS. 7A-7C show front views of a display device and a support device wherein the display device shows different output based on output of magnetic sensors.
Figure 7B:
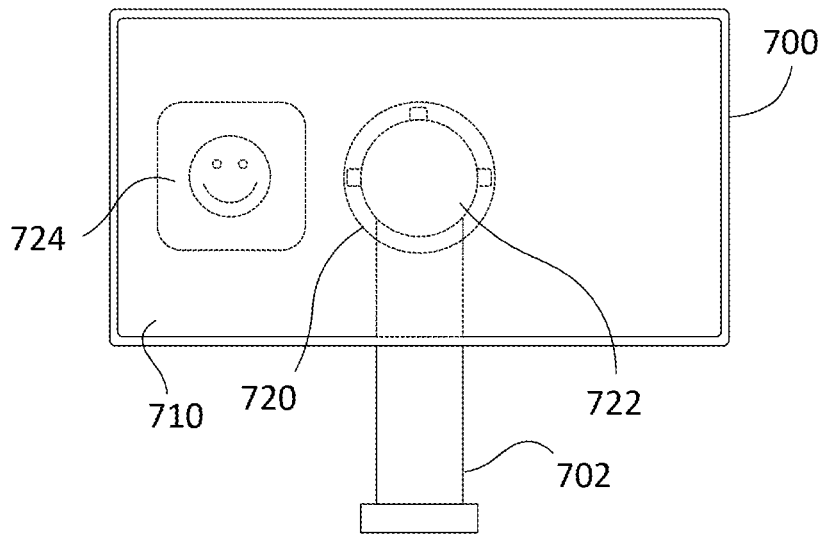
Figure 7C:
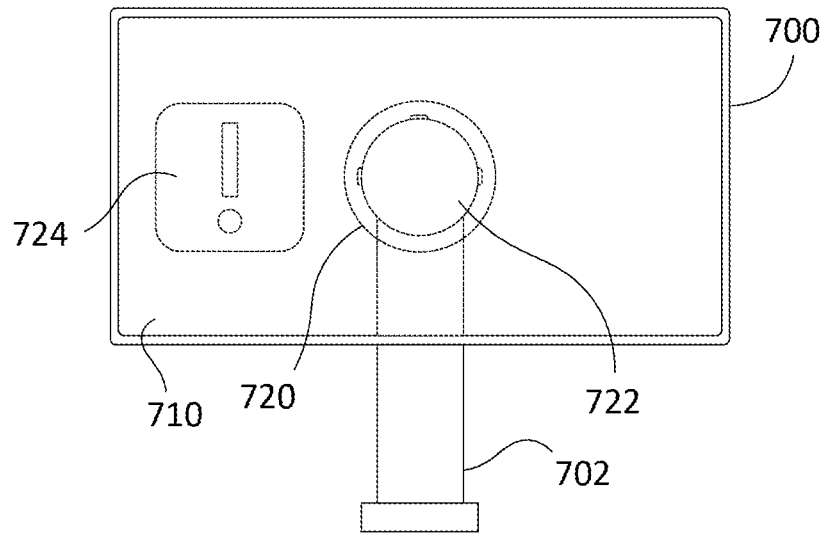

FIGS. 7A-7C show example embodiments of outputs including example information displayed by a display device 700 in response to the indicator signal output in connection with block 606. Using the signals output by the magnetic sensors (e.g., 220), a controller can determine a vector quantity (i.e., a distance/magnitude and direction) that represents the position of the mount portion (e.g., 322) relative to a support connector portion (e.g., 200) of the display device 700. For example, the controller can determine a three-dimensional vector quantity using triangulation via the signals output by multiple magnetic sensors. In some embodiments, a similar three-dimensional vector quantity can be calculated, wherein the vector quantity represents the direction and strength of the magnetic field experienced by one or more magnetic sensors on the display device 700.

In either case, the controller can determine a difference between the three-dimensional vector quantity calculated from the signals of the magnetic sensors and a target three-dimensional vector quantity (or a range of target three-dimensional vector quantities). When the calculated-sensor-output vector matches the target vector (or lies within the range of target vectors), or vice versa, the controller can output an indicator signal or alert to help inform the user about the position of the display device relative to the support device or to provide instructions regarding how to change the relative positions of the devices in order for the vectors to match. In other words, the controller can take a difference between the calculated vector and the target vector, and, if the difference is within an acceptable range or matches an expected value (e.g., the difference is zero), the controller can output an alert or signal (including a visual, audio and/or haptic alert) indicating that the display device is attached to a proper mount. Otherwise, the controller can output an alert or signal indicating that a problem has been detected, what the problem is, and/or how to fix it.

FIG. 7A shows one example embodiment of such an alert or indicator signal being shown on the display device 700. The display device 700 can therefore be referred to as an indicator since it is indicating information about an electrical property of the magnetic sensor in the display. In this case, the support device 702 has its mount portion laterally offset from the support connector portion of the display device 700. As explained above, this status can be determined by comparing a vector quantity based on the estimated distance and direction determined by measurements from the magnetic sensors of the support connector portion and the mount portion. FIG. 7A depicts a front view of the display device 700 and the support device 702 wherein the display screen 710 of the display device 700 can be configured to show the positioning of the support connector portion with a first graphic. The display screen 710 can also show an estimated positioning of the mount portion using a second graphic 722 on the display screen. The first and second graphics can be positioned relative to each other on the display screen 710 in a manner corresponding to the distance between the support connector portion and the support device/mount portion. In this manner, the user can be presented with a simulated view of the relative positions of the devices in order to intuitively indicate to the user how to move the display device 700 for proper mounting on the support device 702. In other words, the first and second graphics 720, 722 can show the appearance of devices and features positioned behind the display device 700 as if the display device 700 was transparent because the positioning of the parts relative to the display device 700 is either static (in the case of the support connector portion) or determined by the magnetic field (in the case of the mount portion). Furthermore, in some embodiments, a third graphic 724 can be output via the display screen 710 to indicate a direction to move the display device 700 or to provide other status information (e.g., the distance to move the display device, whether a support device 702 has been detected, etc.). As the devices 700, 702 move relative to each other, the graphics 720, 722, 724 can also be updated on the display device 700 to represent the relative change of position between the display device 700 and the support device. For example, if the mount portion becomes positioned too high, the third graphic 724 can be updated to instruct the user to move the display device 700 upward to meet it.

When an acceptable support device 702 has been properly mounted to the display device 700, the display screen 710 can show first and second graphics 720, 722 that are aligned and that indicate that the support device 702 and display device 700 are attached to each other, as shown in FIG. 7B. Furthermore, the display screen 710 can be configured to output a third graphic 724 indicating that the connection has been successful or proper, such as an output of text, a "happy face" graphic, or similar confirmation of the successful connection.

If an unacceptable support device 702 has been mounted, or if the support device 702 has been improperly mounted, the display screen 710 can show first and second graphics 720, 722 that alert and indicate that the support device 702 and display device 700 are not attached, that an unsupported support device 702 has been attached, or that something else improper has occurred, as indicated in FIG. 7C. The display screen 710 can accordingly also be configured to output a third graphic 724 indicating that the connection has failed at least one of the criteria, what criteria for the connection has failed, alert text, alert symbols, etc. In some embodiments, the third graphic 724 can be output to warn a user that an improper device has been detected or that the device is improperly connected. In some embodiments, the first and/or second graphics 720, 722 can also provide a status indication, such as by graphically showing that latches on the mount portion of the support device 702 are not properly engaged.

Furthermore, in some embodiments, the third graphics 724 of FIGS. 7A-7C can be displayed in the absence of the first and second graphics 720, 722. Similarly, the first or second graphics 720, 722 can be displayed on the display screen 710 individually or together. Additionally, alerts (including audio alerts or haptic alerts) or other outputs similar to the graphics 720, 722, 724 can be output and displayed on another connected electronic device (whether wired or through wireless connection), such as an external computing device (e.g., a smartphone, tablet computer, smart watch, etc.).

FIG. 8 is a block diagram showing elements of a computing system 800 that can be used in embodiments of a controller or computing device (e.g., electronic device 108) configured to implement aspects of the methods and systems disclosed herein. The computing system 800 can be used in conjunction with the display devices and support devices disclosed herein. Alternatively, the computing system 800 can be a separate system embodied in a remote device connectable to the display devices or support devices. For example, the computing system 800 can be embodied as a personal computer, a server, a set of computing devices, similar devices, and combinations thereof.

Accordingly, FIG. 8 is a block diagram of a computer system 800 or computing device according to an embodiment of the present disclosure. In various examples, the computer system 800 can include various sets and subsets of the components shown in FIG. 8. Thus, FIG. 8 shows a variety of components that can be included in various combinations and subsets based on the operations and functions performed by the system 800 in different embodiments. It is noted that, when described or recited herein, the use of the articles such as "a" or "an" is not considered to be limiting to only one, but instead is intended to mean one or more unless otherwise specifically noted herein.

The computer system 800 can include a central processing unit (CPU) or processor 802 connected via a bus 804 for electrical communication to a memory device 806, a power source 808, an electronic storage device 810, a network interface 812, an input device adapter 816, and an output device adapter 820. For example, one or more of these components can be connected to each other via a substrate (e.g., a printed circuit board or other substrate) supporting the bus 804 and other electrical connectors providing electrical communication between the components. The bus 804 can include a communication mechanism for communicating information between parts of the system 800.

The processor 802 can be a microprocessor or a similar device configured to receive and execute a set of electronic instructions 824 stored by the memory 806. The memory 806 can be referred to as main memory, such as random access memory (RAM) or another dynamic electronic storage device for storing information and instructions to be executed by the processor 802. The memory 806 can also be used for storing temporary variables or other intermediate information during execution of instructions executed by the processor 802. The storage device 810 can include read-only memory (ROM) or another type of static storage device coupled to the bus 804 for storing static or long-term (i.e., non-dynamic) information and instructions for the processor 802. For example, the storage device 810 can include a magnetic or optical disk (e.g., hard disk drive (HDD)), a solid state memory (e.g., a solid state disk (SSD)), or a comparable device. The power source 808 can include a power supply capable of providing power to the processor 802 and other components connected to the bus 804, such as a connection to an electrical utility grid or a battery system.

The instructions 824 can include information for executing processes and methods using components of the system 800 and other components connected to the system 800. Such processes and methods can include, for example, the methods described elsewhere herein, such as, for example, methods of providing indicators based on output from magnetic sensors on a display device.

The network interface 812 can include an adapter for connecting the system 800 to an external device via a wired or wireless connection. For example, the network interface 812 can provide a connection to a computer network 826 such as a cellular network, the Internet, a local area network (LAN), a separate device capable of wireless communication with the network interface 812, other external devices or network locations, and combinations thereof. In one example embodiment, the network interface 812 is a wireless networking adapter configured to connect via WI-FI, BLUETOOTH, BLE, LTE, Bluetooth mesh, or a related wireless communications protocol to another device having interface capability using the same protocol. In some embodiments, a network device or set of network devices in the network 826 can be considered part of the system 800. In some cases, a network device (e.g., a connected smartphone, tablet computer, wearable computing device, etc.) can be considered connected to, but not a part of, the system 800.

The input device adapter 816 can be configured to provide the system 800 with connectivity to various input devices such as, for example, orientation sensors 814 (e.g., which indicate orientation of the display device or support device), magnetic sensors 828 (e.g., Hall effect sensors), other input devices, related devices, and combinations thereof.

The output device adapter 820 can be configured to provide the system 800 with the ability to output information and signals, such as by providing visual output using one or more display screens 832, by providing audible output using one or more speakers 835, or by providing indications via lights 837 or movement actuators (e.g., motors). The processor 802 can be configured to control the output device adapter 820 to provide information to a user via the output devices connected to the adapter 820.

The instructions 824 can include electronic instructions that, when executed by the processor 802, can perform methods and processes as described in further detail elsewhere herein. The instructions 824 can be stored or encoded on a non-transitory computer readable medium, and the instructions 824, when executed by a computing device such as, for example, processor 802, cause the computing device to perform methods and processes as described in further detail elsewhere herein. See, e.g., FIGS. 5-7C.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A support system for an electronic device, the support system comprising:
   a housing structure comprising a support connector portion configured to magnetically couple the housing structure to a support device;
   an electronic circuit; and a magnetic sensor in the housing structure and in electronic communication with the electronic circuit, wherein the magnetic sensor is configured to output a signal to the electronic circuit based on a magnetic field sensed from the support connector portion;

wherein the signal is used to notify a user, via the electronic circuit, that the coupling of the support device and the housing structure is not complete.

2. The support system of claim 1, wherein:
the housing structure is part of a display screen;
the support connector portion comprises a recess configured to receive the support device;
the magnetic sensor is positioned adjacent the recess; and
the magnetic sensor is configured to detect the magnetic field emitted from the support device while the support device is received by the recess.

3. The support system of claim 1, wherein the housing structure is part of a display screen.

4. The support system of claim 1, wherein the signal is variable based on a magnitude of the magnetic field.

5. The support system of claim 1, wherein the support connector portion comprises a recess to receive the support device.

6. The support system of claim 5, wherein the magnetic sensor is positioned adjacent the recess.

7. The support system of claim 1, wherein the signal is emitted when the magnetic sensor senses that the magnetic field is within a range of values through which output of the magnetic sensor is proportional to the magnetic field sensed.

8. The support system of claim 7, wherein the range of values comprises a lower boundary and an upper boundary, with the lower boundary being non-zero, and with output of the magnetic sensor at the upper boundary being proportional to the magnetic field sensed.

9. The support system of claim 1, wherein the signal indicates an orientation of the support connector portion relative to the support device.

10. A support system for an electronic device, the support system comprising:
a support mount having a magnetic structure;
a display device housing having a magnetic sensor configured to sense a magnetic field emitted from the magnetic structure, the display device housing being mountable to the support mount;
a computing device in electronic communication with the magnetic sensor and configured to:
detect an output signal by the magnetic sensor; and
output an indicator signal indicating a direction to move the display device housing relative to the support mount.

11. The support system of claim 10, wherein the computing device is further configured to output a second indicator signal indicating that the sensed magnetic field is within or not within a range of values.

12. The support system of claim 10, wherein outputting the indicator signal comprises displaying a graphic via a display device in the display device housing.

13. The support system of claim 10, wherein the indicator signal indicates an offset of the magnetic structure relative to the display device housing.

14. The support system of claim 10, wherein the magnetic sensor comprises Hall effect sensors and the support mount comprises permanent magnets.

15. A support system for an electronic device, the support system comprising:
a support mount having a magnetic structure;
a display device housing having a magnetic sensor configured to sense a magnetic field emitted from the magnetic structure, the display device housing being mountable to the support mount;
a computing device in electronic communication with the magnetic sensor and configured to:
detect an output signal by the magnetic sensor; and
output an indicator signal indicating whether the sensed magnetic field is within a range of values;
wherein the magnetic sensor comprises Hall effect sensors and the support mount comprises permanent magnets, wherein the Hall effect sensors are spatially arranged in a first pattern in the display device housing, and wherein the permanent magnets are spatially arranged in a second pattern in the support mount such that when the display device is mounted to the support mount the first pattern is superimposed over the second pattern with the Hall effect sensors interposed between the permanent magnets.

16. A display support system, comprising:
a support stand having a connector end, the connector end having a magnetic element configured to output a magnetic field;
a display, including:
a housing having a connector portion configured to receive the connector end of the support stand when the support stand supports the display;
a display screen positioned in the housing; and
a magnetic sensor having an electrical property configured to change in response to a change in position of the connector end of the support stand relative to the connector portion of the display housing.

17. The display support system of claim 16, wherein the support stand further includes a set of latches configured to hold the connector end to the connector portion.

18. The display support system of claim 16, further comprising an indicator to output a signal in response to the connector end of the support stand being attached to the connector portion of the housing.

19. The display support system of claim 18, wherein the indicator is output via the display screen.

20. The display support system of claim 16, wherein the electrical property is a voltage of the magnetic sensor.

\* \* \* \* \*